United States Patent
Lee et al.

(10) Patent No.: US 9,087,768 B2
(45) Date of Patent: Jul. 21, 2015

(54) NITRIDE BASED HETEROJUNCTION SEMICONDUCTOR DEVICE AND MANUFACTURING METHOD THEREOF

(71) Applicant: SAMSUNG ELECTRONICS CO., LTD., Gyeonggi-do (KR)

(72) Inventors: Jae Hoon Lee, Gyeonggi-do (KR); Jae Hyun Jeong, Gyeonggi-do (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 87 days.

(21) Appl. No.: 13/759,923

(22) Filed: Feb. 5, 2013

(65) Prior Publication Data
US 2013/0200388 A1    Aug. 8, 2013

(30) Foreign Application Priority Data
Feb. 6, 2012   (KR) .................. 10-2012-0011897

(51) Int. Cl.
| | |
|---|---|
| H01L 29/66 | (2006.01) |
| H01L 29/205 | (2006.01) |
| H01L 29/872 | (2006.01) |
| H01L 29/201 | (2006.01) |
| H01L 29/20 | (2006.01) |

(52) U.S. Cl.
CPC ............ *H01L 29/205* (2013.01); *H01L 29/201* (2013.01); *H01L 29/872* (2013.01); *H01L 29/2003* (2013.01)

(58) Field of Classification Search
CPC ............. H01L 29/205; H01L 29/7786; H01L 29/66431; H01L 29/66462; H01L 29/778
USPC ............ 257/192, 194, E29.246, 35; 438/197
See application file for complete search history.

(56) References Cited

U.S. PATENT DOCUMENTS

| | | | | |
|---|---|---|---|---|
| 3,751,687 | A | * | 8/1973 | Jutzi .............................. 327/208 |
| 7,400,001 | B2 | * | 7/2008 | Lee et al. ....................... 257/194 |
| 2007/0228505 | A1 | | 10/2007 | Mazzola et al. |
| 2010/0330754 | A1 | | 12/2010 | Hebert |

FOREIGN PATENT DOCUMENTS

| | | |
|---|---|---|
| JP | 2011-061000 A | 3/2011 |
| KR | 2009-0128505 A | 12/2009 |

* cited by examiner

*Primary Examiner* — Kenneth Parker
*Assistant Examiner* — John Lin
(74) *Attorney, Agent, or Firm* — McDermott Will & Emery LLP

(57) ABSTRACT

A nitride based heterojunction semiconductor device includes a gallium nitride (GaN) layer disposed on a substrate, an aluminum (Al)-doped GaN layer disposed on the GaN layer, a Schottky electrode disposed in a first area on the Al-doped GaN layer, an AlGaN layer disposed in a second area on the Al-doped GaN layer, and an ohmic electrode disposed on the AlGaN layer. The first area is different from the second area.

6 Claims, 6 Drawing Sheets

US 9,087,768 B2

NITRIDE BASED HETEROJUNCTION SEMICONDUCTOR DEVICE AND MANUFACTURING METHOD THEREOF

CROSS-REFERENCE TO RELATED APPLICATION

This application claims benefit of priority to Korean Patent Application No. 10-2012-0011897, filed on Feb. 6, 2012, in the Korean Intellectual Property Office, the entire contents of which are hereby incorporated by reference.

TECHNICAL FIELD

The present inventive concept relates to a nitride based heterojunction semiconductor device and manufacturing method thereof that may reduce a leakage current in a Schottky junction area.

BACKGROUND

With rapid development of information and communications industry, a demand for wireless communication technologies, for example, personal mobile communication, wideband communication, military radar, and the like, is gradually rising. Accordingly, there is an increasing need for a high output and high frequency device with a high level of information processing technology. A gallium nitride (GaN) material that can be used for a power amplifier may be suitable for the high output and high frequency device since the GaN material has properties of a relative great energy band gap, a relatively high heat conductivity, and the like, when compared to conventionally used materials such as a silicon (Si) material and a gallium arsenide (GaAs) material.

A semiconductor device, for example, an aluminum gallium nitride (AlGaN)/GaN heterojunction field effect transistor, may have a high band discontinuity at a junction interface, and a high-density of electrons may be freed in the interface. Thus, electron mobility may increase. However, a defect may be generated on a surface of an AlGaN layer due to a difference between the AlGaN layer and a GaN layer in their lattice constants and thermal expansion coefficients. When a greater amount of Al is included in the AlGaN layer, a density of the defect may increase and an oxygen atom may be included in the surface of the AlGaN layer. In this instance, Fermi-Level-Pinning may occur in a Schottky junction process. Accordingly, when a reverse voltage is applied, a tunneling current may occur on the surface of the AlGaN layer corresponding to a Schottky junction area, due to Fermi-Level-Pinning, and a leakage current may flow.

SUMMARY

An aspect of the present inventive concept relates to a nitride based heterojunction semiconductor device and manufacturing method thereof that may reduce a leakage current occurring in a Schottky junction area, by forming a Schottky electrode on a gallium nitride (GaN) layer.

An aspect of the present inventive concept encompasses a nitride based heterojunction semiconductor device, including a GaN layer disposed on a substrate, an aluminum (Al)-doped GaN layer disposed on the GaN layer, a Schottky electrode disposed in a first area on the Al-doped GaN layer, an AlGaN layer disposed in a second area on the Al-doped GaN layer, and an ohmic electrode disposed on the AlGaN layer. The first area may be different from the second area.

The semiconductor device may further include an undoped GaN layer formed on the Al-doped GaN layer.

A content of Al in the Al-doped GaN layer may be in the range of 0.3% to 0.6%.

The Al-doped GaN layer and the undoped GaN layer may have thicknesses in the range of 0.1 micrometers (μm) to 1.0 μm.

Another aspect of the present inventive concept relates to a method of manufacturing a nitride based heterojunction semiconductor device. The method includes growing a GaN layer on a substrate. An Al-doped GaN layer are grown on the GaN layer. An insulating layer is formed in a first area on the Al-doped GaN layer. An AlGaN layer are grown in a second area on the Al-doped GaN layer. The second area may be different from the first area. The insulating layer is removed to expose the first area on the Al-doped GaN layer. A Schottky electrode is formed on the Al-doped GaN layer in an area that is exposed through the first area. An ohmic electrode is formed on the AlGaN layer.

The method may further include growing an undoped GaN layer on the Al-doped GaN layer.

The growing of the GaN layer may include forming a semi-insulating GaN layer by primarily growing a GaN material on the substrate at a low temperature, and secondarily growing the GaN material at a high temperature.

Still another aspect of the present inventive concept encompasses a method of manufacturing a nitride based heterojunction semiconductor device. The method includes growing a gallium nitride (GaN) layer on a substrate. An aluminum (Al)-doped GaN layer is grown on the GaN layer. A Schottky electrode is formed in a first on the Al-doped GaN layer. An AlGaN layer is grown in a second area on the Al-doped GaN layer. The second area may be different from the first area. An ohmic electrode is formed on the AlGaN layer.

The method may further includes growing an undoped GaN layer on the Al-doped GaN layer.

The growing the GaN layer my include forming a semi-insulating GaN layer by primarily growing a GaN material on the substrate at a low temperature, and secondarily growing the GaN material at a high temperature.

BRIEF DESCRIPTION OF THE DRAWINGS

The foregoing and other features of the inventive concept will be apparent from more particular description of embodiments of the present inventive concept, as illustrated in the accompanying drawings in which like reference characters may refer to the same or similar parts throughout the different views. The drawings are not necessarily to scale, emphasis instead being placed upon illustrating the principles of the embodiments of the present inventive concept. In the drawings, the thickness of layers and regions may be exaggerated for clarity.

DETAILED DESCRIPTION

Figure 1:
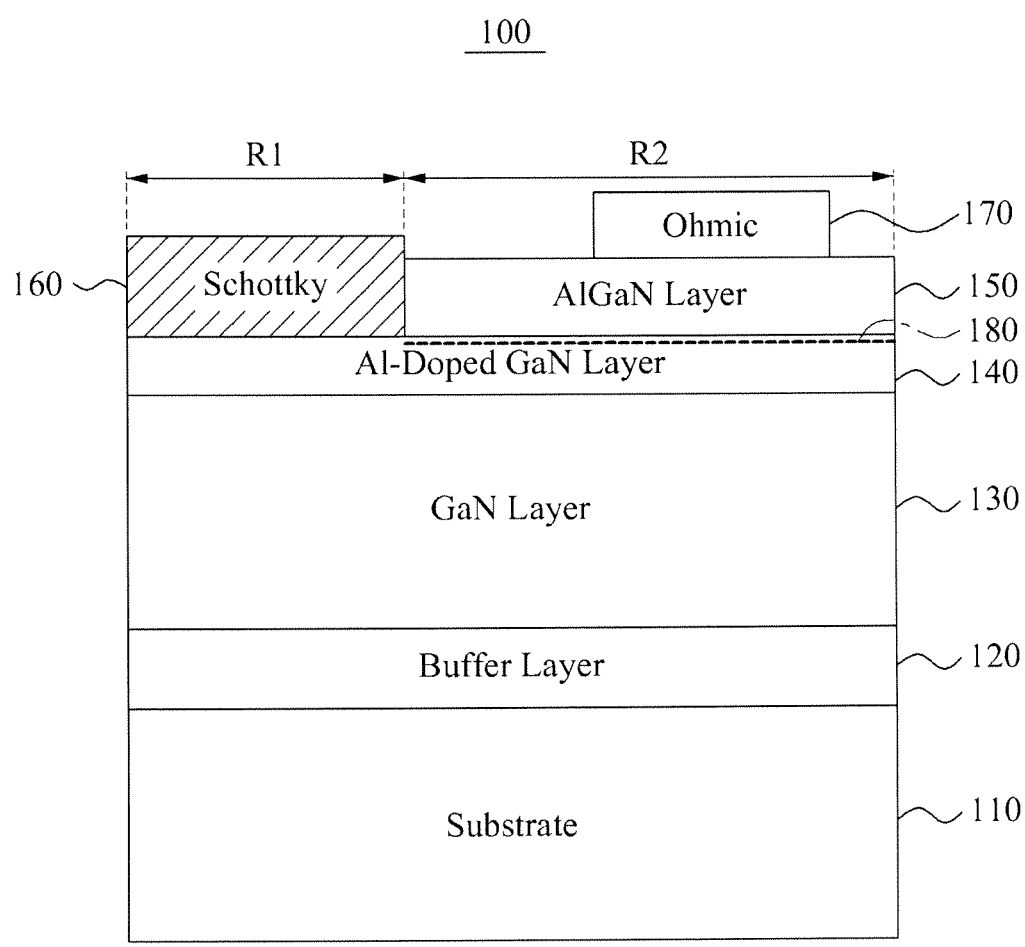
FIG. 1 is a cross-sectional view illustrating a structure of a nitride based heterojunction semiconductor device according to an embodiment of the present inventive concept.

Examples of the present inventive concept will be described below in more detail with reference to the accompanying drawings. The examples of the present inventive concept may, however, be embodied in different forms and should not be construed as limited to the examples set forth herein. Like reference numerals may refer to like elements throughout the specification.

When it is determined that a detailed description is related to a related known function or configuration which may make the purpose of the present inventive concept unnecessarily ambiguous in the description of the present inventive concept, such detailed description will be omitted. Also, terminologies used herein are defined to appropriately describe the exemplary embodiments of the present inventive concept and thus may be changed depending on a user, the intent of an operator, or a custom. Accordingly, the terminologies must be defined based on the following overall description of this specification.

In the description of embodiments of the present inventive concept, it will be understood that when a layer is referred to as being "on" another layer or substrate, it can be directly on the other layer or substrate, or intervening layers may also be present.

FIG. 1 is a cross-sectional view illustrating a structure of a nitride based heterojunction semiconductor device 100 according to an embodiment of the present inventive concept. The semiconductor device 100 may be a nitride based heterojunction Schottky diode, including a substrate 110, a buffer layer 120, a gallium nitride (GaN) layer 130, an aluminum (Al)-doped GaN layer 140, an AlGaN layer 150, a Schottky electrode 160, and an ohmic electrode 170.

The buffer layer 120 may be formed on the substrate 110. Although the substrate 110 may be a sapphire substrate, it is not limited thereto. Here, the substrate 110 may be a substrate for growing nitride, for example, a silicon carbide (SiC) substrate, a nitride substrate, and the like. The buffer layer 120 may be an AlN or GaN based nitride layer, grown at a low temperature.

The GaN layer 130 may be formed on the buffer layer 120. The GaN layer 130 may be a semi-insulating high resistance GaN layer. The GaN layer 130 may be grown at a low temperature, and at a high temperature. For example, the GaN layer 130 may be primarily grown at a temperature ranging from 800° C. to 950° C. to secure a high resistance, and then may be secondarily grown at a temperature increased to the range of 1000 to 1100° C. at which a single crystal may be grown.

The Al-doped GaN layer 140 may be formed on the GaN layer 130.

The Al-doped GaN layer 140 may improve crystallizability, and may improve an electrical property of a Schottky diode. That is, the Al-doped GaN layer 140 may passivate a gallium (Ga) vacancy that exists as a defect, using doped Al, thereby restraining a growth of a two-dimensional or three dimensional dislocation. Thus, the Al-doped GaN layer 140 may have excellent crystallizability. Accordingly, the Al-doped GaN layer 140 may keep the GaN layer 130 from having low crystallizability. This may accomplish excellent crystal growth. Here, a content of Al to be doped may not exceed 1%. In order to sufficiently improve crystallizability, a desirable content of Al to be doped may be in the range of 0.1% to 1%, a more desirable content of Al to be doped may be in the range of 0.3% to 0.6%, and the most desirable content of Al to be doped may be about 0.45%.

The Al-doped GaN layer 140 may have a thickness in the range of 0.1 to 1 micrometer (μm). When the Al-doped GaN layer 140 has a thickness less than 0.1 μm, sufficient growth is unlikely and the effect of crystallizability improvement may not be achieved. When the Al-doped GaN layer 140 has a thickness greater than 1 μm, an increase in a size of an element may occur when the effect of crystallizability improvement may become almost saturated.

The Al-doped GaN layer 140 may have a first area R1 and a second area R2. The first area R1 may correspond to a Schottky junction area, and the second area R2 may correspond to a heterojunction area for the AlGaN layer 150. That is, the AlGaN layer 150 may be formed in the second area R2 of the Al-doped GaN layer 140.

The AlGaN layer 150 may provide an ohmic junction area. Also, a two-dimensional electron gas (2-DEG) channel layer 180 may be formed at an interface between the AlGaN layer 150 and the Al-doped GaN layer 140.

Since the AlGaN layer 150 may be formed in only the second area R2 of the Al-doped GaN layer 140, the Al-doped GaN layer 140 may be exposed.

The Schottky electrode 160 may be bonded to the first area R1 of the Al-doped GaN layer 140 to form a Schottky junction. As shown in FIG. 1, the Schottky electrode 160 may be formed on the Al-doped GaN layer 140, instead of being formed on the AlGaN layer 150, whereby a leakage current in the Schottky junction area may be reduced. When compared to the AlGaN layer 150, the Al-doped GaN layer 140 may include a lower amount of Al, thereby having a relatively low defect density.

If the defect density is high, the Al-doped GaN layer 140 would include an oxygen atom on a surface, and Fermi-Level-Pinning would occur in a Schottky junction process. However, since the Al-doped GaN layer 140 may have a relatively low defect density and excellent crystallizability, Fermi-Level-Pinning may not occur. Accordingly, when a reverse voltage is applied to the Schottky electrode 160, a tunneling current may be absent in the first area R1 of the Al-doped GaN layer 140 corresponding to the Schottky junction area, and a leakage current may be reduced considerably.

The ohmic electrode 170 may be bonded to the AlGaN layer 150 to form ohmic junction.

In the semiconductor device 100, since the Schottky junction area may be included in the Al-doped GaN layer 140, a surface state of the Schottky junction area may be stabilized, and an occurrence of a leakage current may be prevented. Accordingly, a reliability of the semiconductor device 100 may be increased.

Figure 2:
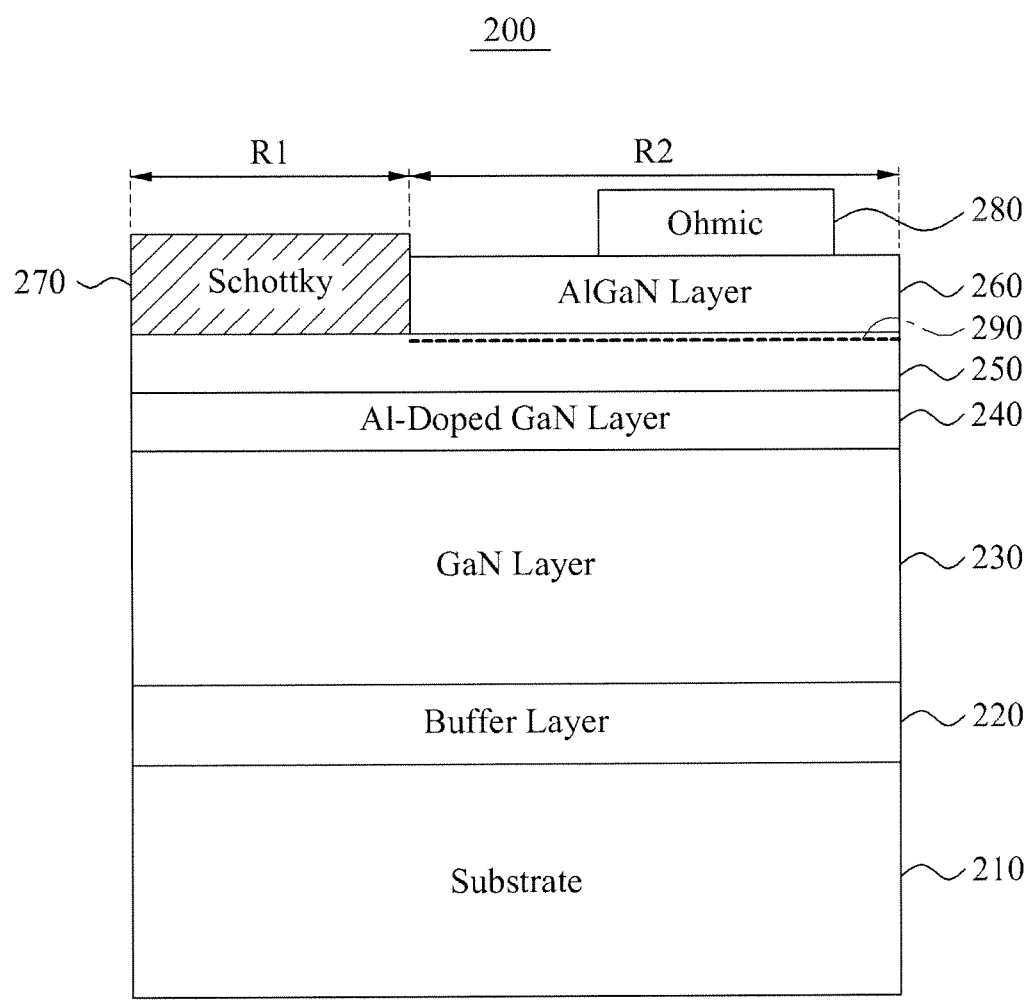
FIG. 2 is a cross-sectional view illustrating a structure of a nitride based heterojunction semiconductor device according to another embodiment of the present inventive concept.

FIG. 2 is a cross-sectional view illustrating a structure of a nitride based heterojunction semiconductor device 200 according to another embodiment of the present inventive concept. The semiconductor device 200 may be a normally-OFF type of nitride based heterojunction field effect transistor, including a substrate 210, a buffer layer 220, a GaN layer 230, an Al-doped GaN layer 240, an undoped GaN layer 250, an AlGaN layer 260, a Schottky electrode 270, and an ohmic electrode 280.

Elements, excluding the undoped GaN layer 250, in the semiconductor device 200 of FIG. 2 may be identical to elements included in the semiconductor device 100 of FIG. 1. Thus, duplicated descriptions will be omitted for conciseness.

The undoped GaN layer 250 may be formed on the Al-doped GaN layer 240 to have a thickness in the range of 0.1 μm to 1 μm. The undoped GaN layer 250 may have improved crystallizability, similar to the Al-doped GaN layer 240, and may improve an electrical property of the semiconductor device 200.

The undoped GaN layer 250 may have much higher crystallizability based on the crystallizability of the Al-doped GaN layer 240. Accordingly, relatively high electron mobility may be obtained at a 2-DEG channel layer 290 which is formed at an interface between the AlGaN layer 260 and the undoped GaN layer 250.

Also, the undoped GaN layer 250 may prevent a decrease in an electron mobility that may occur when the semiconductor device 200 is operated at a high temperature. As shown in FIG. 1, the 2-DEG channel layer 180 formed at the interface between the Al-doped GaN layer 140 and the AlGaN layer 150 may decrease electron mobility since a small amount of Al doped at a high temperature may act as a scattering center. However, since the undoped GaN layer 250 may not include Al, the 2-DEG channel layer 290 may have higher electron mobility when compared to the 2-DEG channel layer 180 of FIG. 1.

Although the semiconductor device 200 includes a pair of the Al-doped GaN layer 240 and the undoped GaN layer 250 in FIG. 2, at least two pairs of the Al-doped GaN layer 240 and the undoped GaN layer 250 may be included.

The Al-doped GaN layer 240 and the undoped GaN layer 250 may have a first area R1 and a second area R2. In the semiconductor device 200, the first area R1 and the second area R2 may be distinguished in order to indicate a Schottky junction area and an ohmic junction area on the Al-doped GaN layer 240 and the undoped GaN layer 250.

The Schottky electrode 270 may be formed in the first area R1 on the Al-doped GaN layer 240, and may be substantially bonded to the undoped GaN layer 250 to form a Schottky junction.

When the Schottky electrode 270 is formed on the undoped GaN layer 250, instead of being formed on the AlGaN layer 260, a leakage current in the Schottky junction area may be reduced. Since the Al-doped GaN layer 240 may include a less amount of Al, when compared to the AlGaN layer 260, a defect density may be relatively low.

The AlGaN layer 260 may be formed on the undoped GaN layer 250 which is formed on the Al-doped GaN layer 240. In this instance, the AlGaN layer 260 may be formed in the second area R2. When the AlGaN layer 260 is formed in only the second area R2, the undoped GaN layer 250 may be exposed through the first area R1.

The AlGaN layer 260 may be bonded to the undoped GaN layer 250 through the second area R2 to form a heterojunction. The AlGaN layer 260 may provide an ohmic junction area.

The ohmic electrode 280 may be bonded to the AlGaN layer 260 to form ohmic junction.

FIGS. 3 through 6 are cross-sectional views illustrating a method of manufacturing a nitride based heterojunction semiconductor device according to an embodiment of the present inventive concept.

Figure 3:
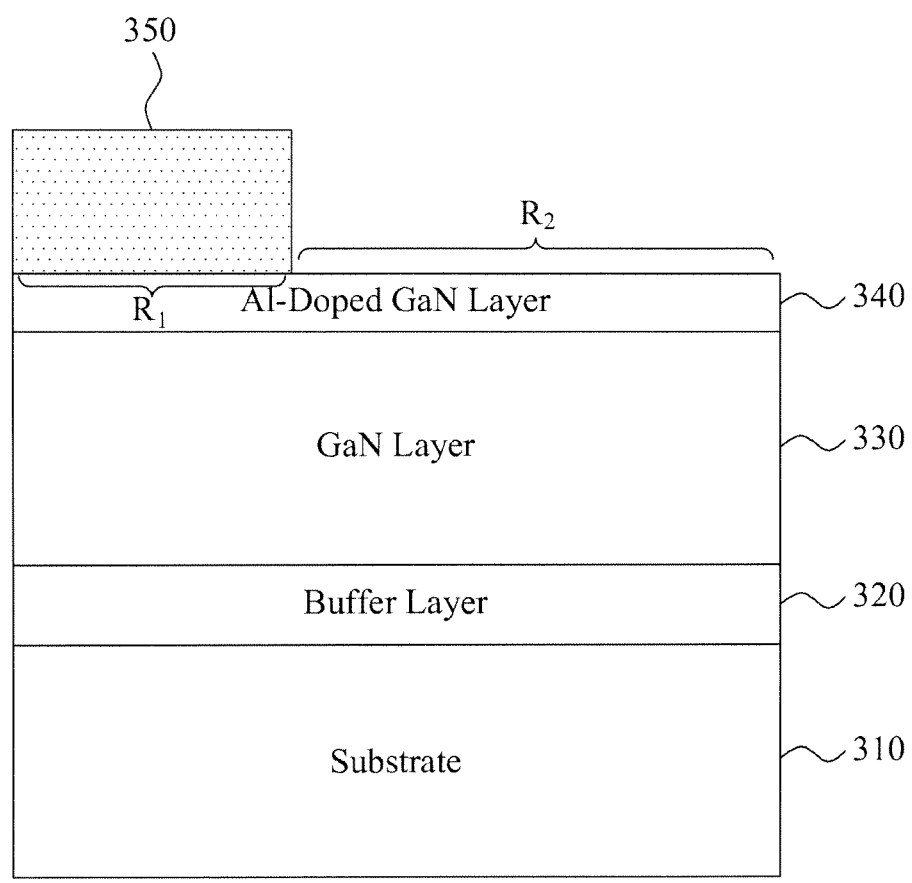
FIGS. 3 through 6 are cross-sectional views illustrating a method of manufacturing a nitride based heterojunction semiconductor device according to an embodiment of the present inventive concept.

FIG. 3 illustrates a process of sequentially growing a GaN layer 330 and an Al-doped GaN layer 340 on a substrate 310 including a buffer layer 320, and forming an insulating layer 350.

The buffer layer 320 may be formed by growing, at a low temperature in the range of 500° C. to 550° C., an AlN or GaN based nitride layer on the substrate 310 used for growing nitride. The substrate 310 may be, for example, a sapphire substrate, a silicon carbide (SiC), a nitride substrate, or the like.

After the buffer layer 320 is formed, the GaN layer 330, that may be, for example, a semi-insulating high resistance GaN layer, may be grown by forming, on the buffer layer 320, a gallium (Ga) vacancy that may act as a deep-level trap, by adjusting a grain size. The GaN layer 330 may be formed by primarily growing a GaN material at a low temperature and then secondarily growing the GaN material at a high temperature on the substrate 310.

The Al-doped GaN layer 340 may be formed on the GaN layer 330 by doping Al. The Al-doped GaN layer 340 may include Al in the range of 0.1% to 1%, and may have a thickness in the range of 0.1 μm to 1 μm.

The insulating layer 350 may be formed in a first area R1 on the Al-doped GaN layer 340. In particular, the insulating layer 350 may be formed by depositing, on an entire surface of the Al-doped GaN layer 340, an insulating material, for example, silicon oxide ($SiO_x$), silicon nitride ($SiN_x$), and the like, and etching only the insulating material deposited in a second area R2.

Although not separately shown in FIG. 3, an undoped GaN layer may be grown on the Al-doped GaN layer 340 before forming the insulating layer 350. Through the undoped GaN layer, crystallizability and electron mobility of the device may be improved.

Figure 4:
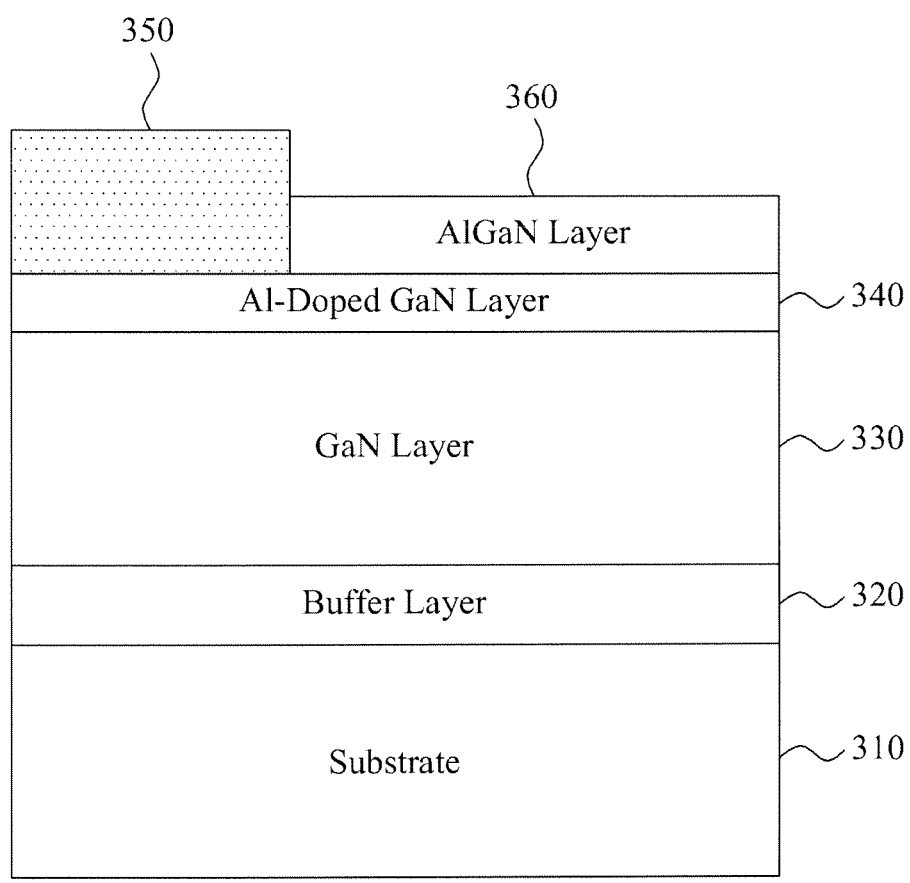

FIG. 4 illustrates a process of growing an AlGaN layer 360 in the second area R2 on the Al-doped GaN layer 340. The AlGaN layer 360 may be grown using a regrowth method, after disposing a structure, for example, the structure illustrated in FIG. 4, in a Metal Organic Chemical Vapor Deposition (MOCVD) chamber. In this instance, since the first area R1 on the Al-doped GaN layer 340 may be protected by the insulating layer 350, the AlGaN layer 360 may be formed only in the second area R2.

Figure 5:
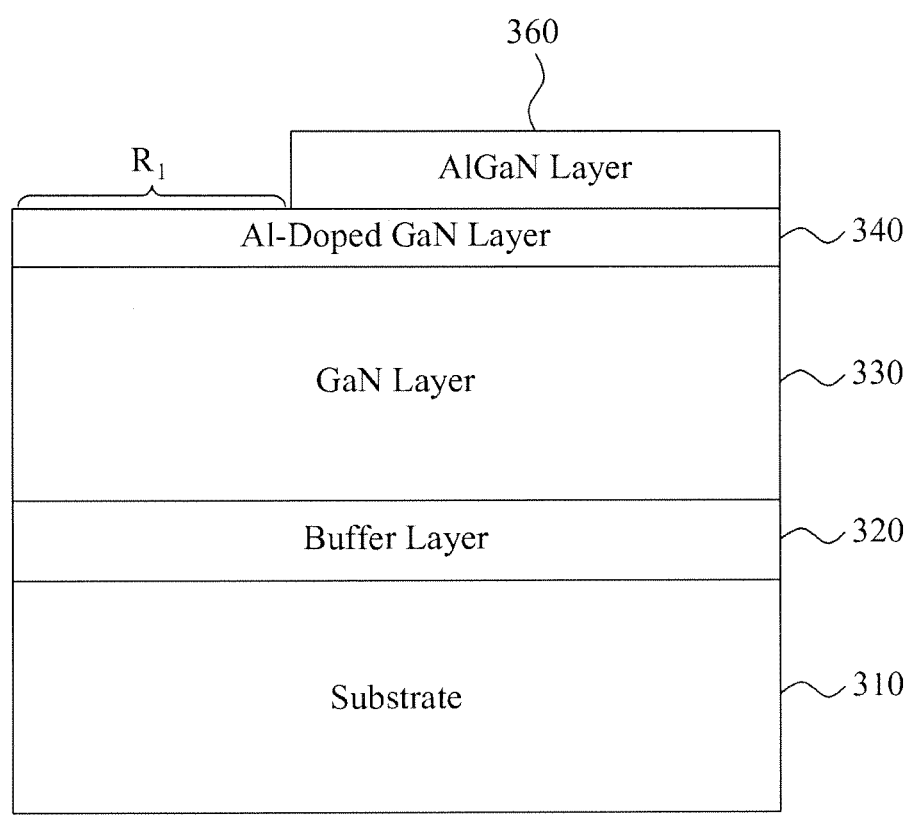

FIG. 5 illustrates a process of removing the insulating layer 350. By etching the insulating layer 350, the first area R1 on the Al-doped GaN layer 340 may be exposed. The first area R1 may correspond to a Schottky junction area.

Figure 6:
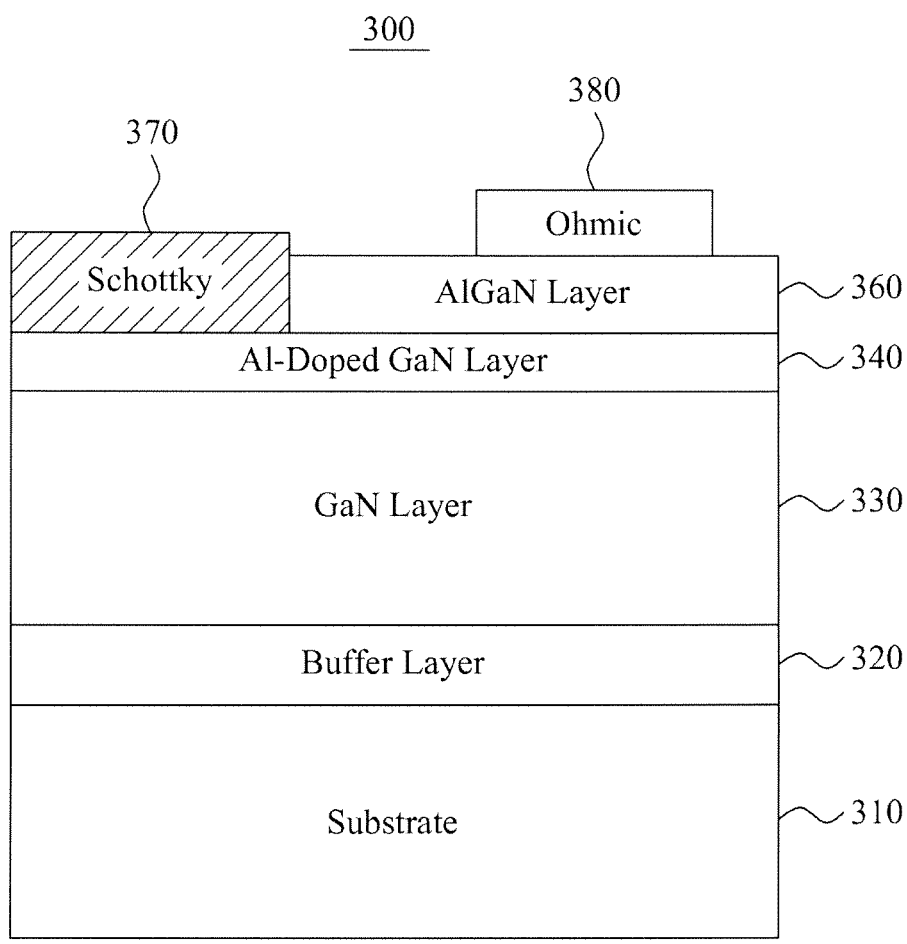

FIG. 6 illustrates a process of manufacturing a semiconductor device 300 by forming a Schottky electrode 370 and an ohmic electrode 380. In particular, the Schottky electrode 370 may be formed on the Al-doped GaN layer 340 that has been exposed through the first area R1 after the process of FIG. 5, and the ohmic electrode 380 may be formed on the AlGaN layer 360.

As shown in FIG. 6, when the Schottky electrode 370 is bonded to the Al-doped GaN layer 340 having a relatively low defect density, when compared to the AlGaN layer 360, to form a Schottky junction, a leakage current in the Schottky junction area may be reduced.

According to exemplary embodiments, a nitride based heterojunction semiconductor device and manufacturing method thereof may reduce a leakage current occurring in the Schottky junction area, by forming a Schottky electrode on a GaN layer.

Although a few exemplary embodiments of the present inventive concept have been shown and described, the present inventive concept is not limited to the described exemplary embodiments. Instead, it would be appreciated by those skilled in the art that changes may be made to these exemplary embodiments without departing from the principles and spirit of the inventive concept, the scope of which is defined by the claims and their equivalents.

What is claimed is:
1. A nitride based heterojunction semiconductor device, comprising:
   a gallium nitride (GaN) layer disposed on a substrate;
   an aluminum (Al)-doped GaN layer disposed on the GaN layer;
   a Schottky electrode disposed in a first area on the Al-doped GaN layer, and in direct physical contact with the Al-doped GaN layer;

an AlGaN layer formed in a second area on the Al-doped GaN layer, the second area being different from the first area; and an ohmic electrode disposed on the AlGaN layer.

2. The semiconductor device of claim 1, further comprising:

an undoped GaN layer disposed on the Al-doped GaN layer.

3. The semiconductor device of claim 2, wherein the Al-doped GaN layer and the undoped GaN layer have thicknesses in the range of 0.1 micrometers (μm) to 1.0 μm.

4. The semiconductor device of claim 1, wherein a content of Al in the Al-doped GaN layer is in the range of 0.3% to 0.6%.

5. The semiconductor device of claim 1, further comprising:

a buffer layer disposed between the substrate and the GaN layer.

6. The semiconductor device of claim 5, wherein the buffer layer comprises an AlN or GaN based nitride layer.

* * * * *